US008895343B2

(12) United States Patent
Peterson et al.

(10) Patent No.: US 8,895,343 B2
(45) Date of Patent: Nov. 25, 2014

(54) HIGH DENSITY CAPACITOR INTEGRATED INTO FOCAL PLANE ARRAY PROCESSING FLOW

(71) Applicant: DRS RSTA, Inc., Dallas, TX (US)

(72) Inventors: Kirk D. Peterson, Allen, TX (US);
Eugene E. Krueger, Allen, TX (US);
Cari A. Ossenfort, Dallas, TX (US);
Daniel B. Jardine, Plano, TX (US);
George D. Skidmore, Richardson, TX (US)

(73) Assignee: DRS RSTA, Inc., Dallas, TX (US)

( * ) Notice: Subject to any disclaimer, the term of this patent is extended or adjusted under 35 U.S.C. 154(b) by 0 days.

(21) Appl. No.: 13/859,874

(22) Filed: Apr. 10, 2013

(65) Prior Publication Data
US 2014/0138786 A1 May 22, 2014

Related U.S. Application Data

(60) Provisional application No. 61/622,438, filed on Apr. 10, 2012.

(51) Int. Cl.
*H01L 21/00* (2006.01)
*H01L 27/144* (2006.01)
*H01L 27/146* (2006.01)

(52) U.S. Cl.
CPC ...... *H01L 27/14609* (2013.01); *H01L 27/1443* (2013.01); *H01L 27/14632* (2013.01); *H01L 27/14649* (2013.01); *H01L 27/14687* (2013.01)
USPC ............................................ 438/59; 257/432

(58) Field of Classification Search
USPC ...................... 438/59, 48; 257/432
See application file for complete search history.

(56) References Cited

U.S. PATENT DOCUMENTS

| 5,128,534 | A | 7/1992 | Wyles et al. |
| 5,414,588 | A | 5/1995 | Barbee et al. |
| 5,962,856 | A | 10/1999 | Zhao et al. |
| 6,531,700 | B1 | 3/2003 | Brown et al. |
| 7,218,048 | B2 | 5/2007 | Choi et al. |
| 7,459,686 | B2 | 12/2008 | Syllaios et al. |
| 7,551,059 | B2 | 6/2009 | Farrier |
| 2007/0138397 | A1 | 6/2007 | Zelakiewicz et al. |
| 2007/0153109 | A1 | 7/2007 | Lule |
| 2008/0079704 | A1 | 4/2008 | Joshi et al. |
| 2009/0179296 | A1 | 7/2009 | Rhodes et al. |
| 2010/0044552 | A1 | 2/2010 | Chen |
| 2010/0140732 | A1 | 6/2010 | Eminoglu et al. |
| 2012/0043637 | A1 | 2/2012 | King et al. |

OTHER PUBLICATIONS

International Search Report (ISR) and Written Opinion (WO) for corresponding PCT Patent Application PCT/US2013/035912, mailed on Jul. 24, 2013.
W. Tennant, et al., "Advanced Wide FOV Architecture for Image reconstruction and Exploitation—AWARE-Lambda Scale," Teledyne Imaging Sensors, Feb. 2011, 12 pages, Camarillo, CA.
W. Tennant, et al., "Advanced Wide FOV Architecture for Image reconstruction and Exploitation—AWARE-Lambda Scale, An Update," Teledyne Imaging Sensors, Mar. 2012, 8 pages, Camarillo, CA.

*Primary Examiner* — Long Pham
(74) *Attorney, Agent, or Firm* — Kilpatrick Townsend & Stockton LLP

(57) ABSTRACT

Methods and structures of photodetectors are described. The structure may include a readout integrated circuit substrate having an internally integrated capacitor. The structure may additionally include an external capacitor overlying the readout integrated circuit substrate. The external capacitor may be coupled with the internally integrated capacitor of the readout integrated circuit substrate, and configured to operate in parallel with the internally integrated capacitor of the readout integrated circuit substrate. The structure may also include a detector overlying the external capacitor.

7 Claims, 8 Drawing Sheets

HIGH DENSITY CAPACITOR INTEGRATED INTO FOCAL PLANE ARRAY PROCESSING FLOW

CROSS-REFERENCES TO RELATED APPLICATIONS

This application is related to and claims the benefit of, under 35 U.S.C. §119(e), U.S. Provisional Pat. App. Ser. No. 61/622,438 titled "HIGH DENSITY CAPACITOR INTEGRATED INTO FOCAL PLANE ARRAY PROCESSING FLOW." The Provisional application was filed on Apr. 10, 2012, and is hereby incorporated by reference in its entirety for all purposes.

TECHNICAL FIELD

The present technology relates to photodetector equipment and processes. More specifically, the present technology relates to photodetector structures including additional energy storage capacity.

BACKGROUND

As photodetector technology continues to develop, new designs can provide vastly improved resolution as compared to technology of the past. Resolution for photodetectors is at least partially determined by the number of pixels in the array. The more pixels in the detector, the more detail may be provided during imaging operations. However, as the number of pixels increases, the size of the detector may similarly grow. Improved technologies have also allowed manufacturing operations to produce pixels of much smaller size in order to maintain certain form factors, while incorporating more pixels to provide the improved resolution.

Performance of the detector may be affected by the integration capacitance afforded by the device. Accordingly, the more integration capacitance available, the better the performance may be. However, as pixel and array sizing continues to decrease, the size of associated capacitors, often incorporated within the devices, similarly decreases. Because capacitance is at least partially defined by the available capacitor area, reduced component sizing may detrimentally impact integration capacitance.

Thus, there is a need for improved photodetector technology that may produce arrays of adequate resolution while still providing sufficient integration capacitance. These and other needs are addressed by the present technology.

SUMMARY

Exemplary photodetector structures may include a readout integrated circuit substrate having an internally integrated capacitor. The structures may additionally include an external capacitor overlying the readout integrated circuit substrate. The external capacitor may be coupled with the internally integrated capacitor of the readout integrated circuit substrate, and configured to operate in parallel with the internally integrated capacitor of the readout integrated circuit substrate. The structures may also include a detector overlying the external capacitor.

The photodetectors may include a reflector material layer overlying the external capacitor, and located below the detector material. The reflector material may be configured to provide electrical coupling of an electrode of the external capacitor with the readout integrated circuit. The photodetector may include a photodiode in disclosed embodiments. The external capacitor may include a first electrode overlying the readout integrated circuit substrate, and a dielectric material overlying the first electrode. The external capacitor may further include a second electrode overlying the dielectric material. In disclosed embodiments each of the first and second electrodes may include a first layer of electrode material and a second layer of electrode material. The first layer of electrode material of the first electrode and the second layer of the electrode material of the second electrode may include the same material. The first electrode and the second electrode may include a transition metal-containing material. The dielectric material may also include a transition metal-containing material as well as other materials including poor metal-containing materials. The dielectric material may include at least two layers of dielectric material, and in disclosed embodiments may include at least three layers of material. At least two of the layers of dielectric material may include a different material in each layer, and each layer of dielectric material may include a material different from the material directly over which it lies.

Methods are also described for forming a photodetector. The methods may include forming an external capacitor over a substrate, and the external capacitor may be electrically coupled with the substrate. The substrate may also include an internally integrated capacitor. The methods may further include forming a photodetector over the external capacitor. Forming the external capacitor may additionally include forming a first electrode over the substrate, forming a dielectric material over the first electrode, and forming a second electrode over the dielectric material. The dielectric material may include a multilayer dielectric material. The methods may still further include forming a reflector material layer overlying the external capacitor, and the reflector material may be configured to electrically couple the second electrode with the substrate. The external capacitor may be electrically coupled with the substrate at electrical connectors separate from electrical connectors to which the detector material is coupled. The external capacitor may be electrically coupled with the substrate such that the external capacitor and internally integrated capacitor are configured to operate in parallel. The methods may still further include forming a dielectric layer overlying the external capacitor.

Such technology may provide numerous benefits over conventional systems and techniques. For example, increased capacitance may allow improved performance during operation. Moreover, the additional capacitance may allow further reductions in pixel size without detrimentally impacting the detector performance. These and other embodiments, along with many of their advantages and features, are described in more detail in conjunction with the below description and attached figures.

In the appended figures, similar components and/or features may have the same reference label. Further, various components of the same type may be distinguished by following the reference label with a letter that distinguishes among the similar components. If only the first reference label is used in the specification, the description is applicable to any one of the similar components having the same first reference label irrespective of the letter.

DETAILED DESCRIPTION

In accordance with an aspect of the present technology, a capacitor is incorporated into a focal plane array pixel structure overlying the readout integrated circuit ("ROIC"), which may provide integration capacitance on small pixel pitch array structures. With every half-size reduction in pixel pitch to achieve improved resolution, the effective available area may be reduced by a factor of four for incorporating an integration capacitor. However, by adding additional capacitance externally to the ROIC according to the present technology, integration capacitance may be maintained or improved even with decreasing pitch pixel arrays.

Figure 1:
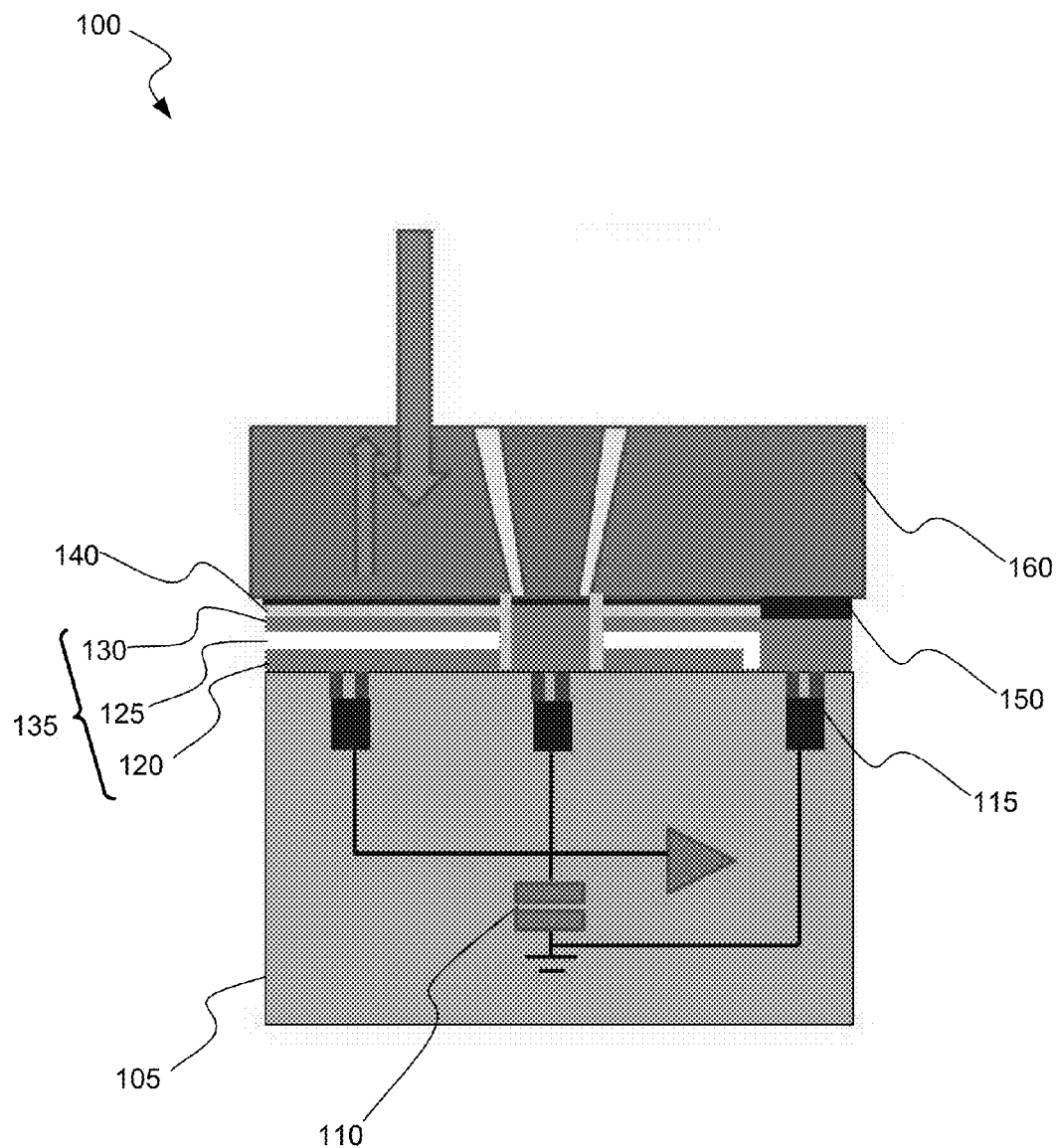
FIG. 1 is a cross-sectional view of an exemplary photodetector structure made according to embodiments of the present technology.

An exemplary cross-section of a portion of a focal plane array 100 according to the present technology is shown in FIG. 1. A ROIC 105 is shown including storage well capacitor 110, or some other internally integrated capacitor, and a plurality of connectors 115. The ROIC may include more or less connectors 115 depending on any need based on the overlying structures, or size constraints based on pixel pitch or other design parameters. As shown in the figure, separate connectors 115 are utilized for the capacitor 135 and detector 160. Additional functional circuitry and elements may be included and may or may not be shown as would be understood by one of skill. The substrate on which the ROIC is formed may be silicon, or alternatively germanium, glass, oxides of Group 14 or Group 15 elements of the periodic table, gallium arsenide, alloys of various poor metals and non-metals including silicon and germanium, etc., or other substrates on which microfabrication may be performed.

Overlying the ROIC is a capacitor 135 structure including bottom electrode 120, dielectric material 125, and top electrode 130. The capacitor may alternatively be termed an external capacitor for differentiation with the ROIC internal capacitor. The capacitor may be connected with the ROIC 105 through one or more connectors 115. The capacitor may provide a source of integration capacitance for the array, and may be run in parallel with or in lieu of the ROIC internal storage well. The electrodes 120, 130 may comprise one or more materials including transition metals such as titanium, or transition metal nitrides, for example, such as titanium nitride. The electrodes 120, 130 may be an additional conductive material that may include a metal, alloy, or other material that may include silver, nickel, copper, platinum, tungsten, iridium, ruthenium, tantalum, chromium, iron, niobium, manganese, aluminum, gallium indium tin, etc., or some combination of one or more of these or other conductive materials.

Alternatively, the electrodes 120, 130 may include a combination of materials and may include multiple layers of material. For example, each electrode may be composed of at least two layers of materials. The materials may in some embodiments be the same or different from one another, and in one exemplary array structure, may include both a metal and a metal nitride layer for improved performance. The bottom electrode 120 may include a first layer of material that may include a transition metal such as titanium. Overlying this first layer of material may be a second layer of material that may include a transition metal nitride such as titanium nitride, for example. Above the dielectric 125, top electrode 130 may be formed in a similar or different structure as bottom electrode 120. For example, if bottom electrode 120 includes a first layer such as titanium, and a second layer such as titanium nitride, then top electrode 130 may include a reversed structure including a first layer of titanium nitride, and a second layer of titanium overlying the first layer. Many other permutations of these structures and layers are included in the present technology.

The dielectric material 125 may include oxides of transition metals or poor or post transition metals. Exemplary dielectrics 125 may include titanium, zirconium, hafnium, tantalum, lanthanum, aluminum, gallium, indium, silicon and other metals that provide suitable dielectric constant, leakage blocking, or some combination of these or other dielectric characteristics. Certain array structures may include multiple layers of dielectric material, and may have more than or about 1, 2, 3, 4, 5, 6, 7, 8, 9, 12, 15, 20, etc., or more layers of dielectric material. The layers of dielectric material may be included in alternating layers of two or more dielectrics. For example, a dielectric 125 may include 3 layers of material that have hafnium oxide, aluminum oxide, and zirconium oxide in layers between the electrodes 120, 130. Alternatively, alternating layers of two materials may be used, such as 5 or 7 layers of hafnium or zirconium oxide and aluminum oxide, for example. Again, many permutations of the structures, materials, and layers are realized with the present technology.

Overlying the capacitor structure may be an insulator 140 separating the capacitor structure from the detector 160. The insulator may be an oxide or nitride providing suitable electrical insulation within the structure, and in one embodiment may be silicon dioxide, for example. Above the insulator may be a reflector material 150 that may perform multiple functions in the overall array structure. The reflector material 150 may include a transition or poor metal, such as titanium or aluminum, or some other metal providing a reflective coating. The reflector material 150 may allow incident signals to the detector 160 to pass through the detector 160 multiple times in order to enhance the likelihood of detection. The reflector material may also provide an electrical connection by which the top electrode may be accessed, as described in more detail below.

Above the reflector material 150 is the detector 160. Detector 160 may be one of many types of photodetector materials that may include photodiodes. The photodetector may be in alternative embodiments a p-on-n photodiode, an n-on-p photodiode, a PIN photodiode, etc. The detector may be operated under a variety of bias schemes including with a high reverse bias to produce avalanche breakdown. The detector may be formed from a variety of materials that may be utilized alone or in combination to produce a resultant bandgap as needed for various circumstances. The materials may include one or more of silicon, germanium, indium, gallium, arsenic, mercury, cadmium, tellurium, lead, sulfur, etc. An exemplary combination is mercury cadmium telluride ("HgCdTe" or "MCT") that may be used in various amounts to produce resultant bandgaps between about 0 and about 1.5 eV.

An additional benefit of the structure of array 100 is that improved device connections can be realized over conventional structures. With reduced pixel pitch, connector 115 size decreases, which reduces the effective area on which overlying structures may be landed on the ROIC. Hence, when vias are etched through the detector material, or the detector is otherwise connected with the ROIC, minor directional errors in processing can lead to a missed connection, and thus a faulty detector. In many conventional arrays, additional layers or materials such as tab metals may be needed to provide improved landing areas at the connectors 115. However, array structure 100 allows the bottom electrode metal 120 to act as a landing material for each of the connectors 115. Additionally, as will be described in detail below, the metal area on which the detector 160 connects provides an improved landing for the detector connection as well as improved grounding capabilities.

Figure 2:
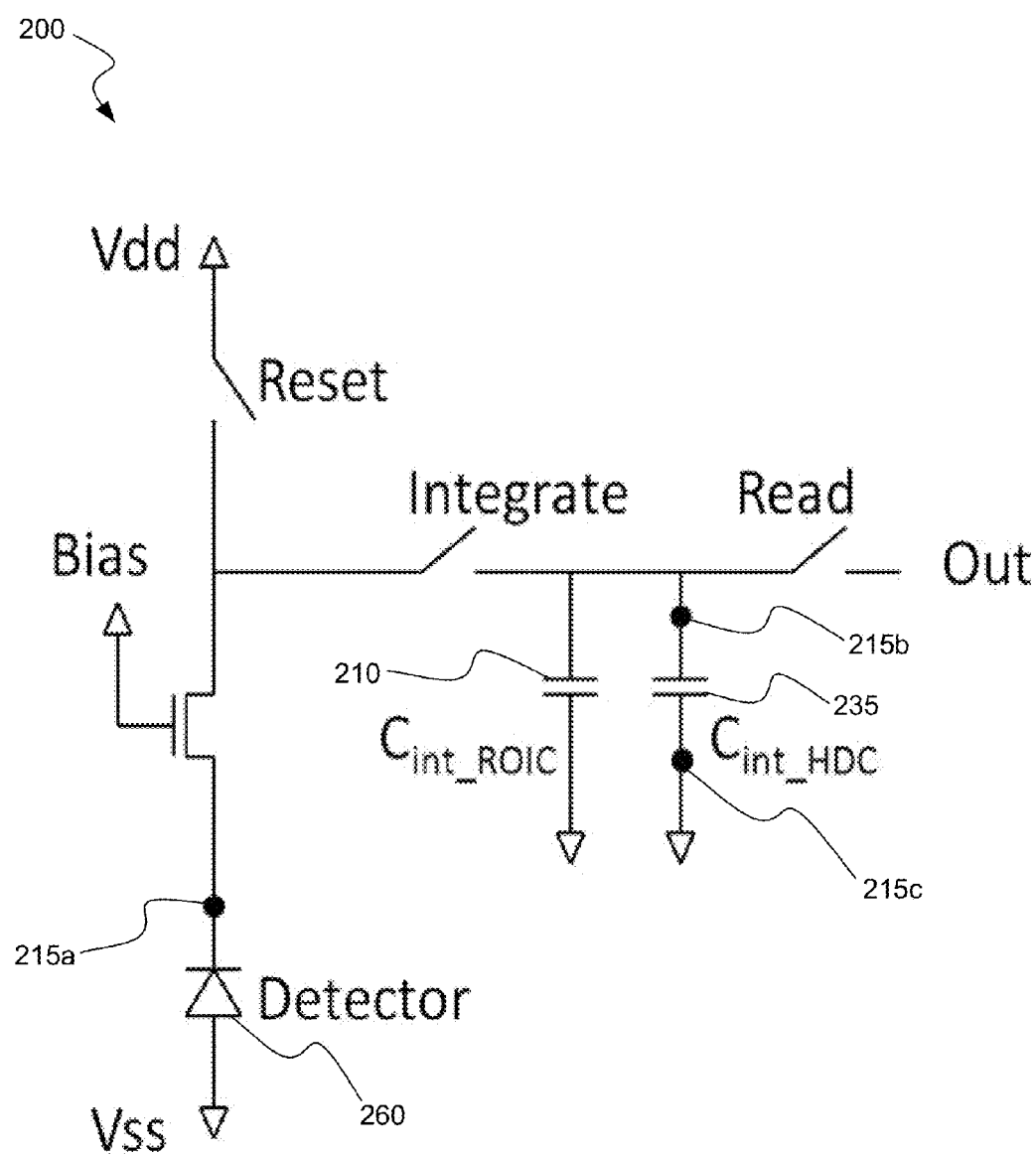
FIG. 2 is a partial circuit diagram of an exemplary photodetector according to embodiments of the present technology.

Turning to FIG. 2, a partial circuit diagram 200 is shown for the high density capacitor incorporated into the focal plane array. Connectors 215 identify the electrical connections provided at connectors 115 from FIG. 1. Connectors 215b and 215c identify locations at which the high density capacitor may be connected with the ROIC. These connections may correspond to the surface points of contact at which internal circuitry may integrate the external capacitor into the ROIC substrate. As shown, the capacitor 235 overlying the ROIC may be incorporated in a parallel fashion with the ROIC storage well capacitor 210 to provide additional integration capacitance. In disclosed embodiments the capacitor 235 may also be operated in series with the storage well capacitor. Alternative designs may allow the capacitor 235 overlying the ROIC to be a singular integration capacitor used during the integration of photocurrent. Detector 260 is shown with n-on-p polarity, however, the detector may also be a p-on-n photodiode, or a PIN photodiode, for example.

Figure 3:
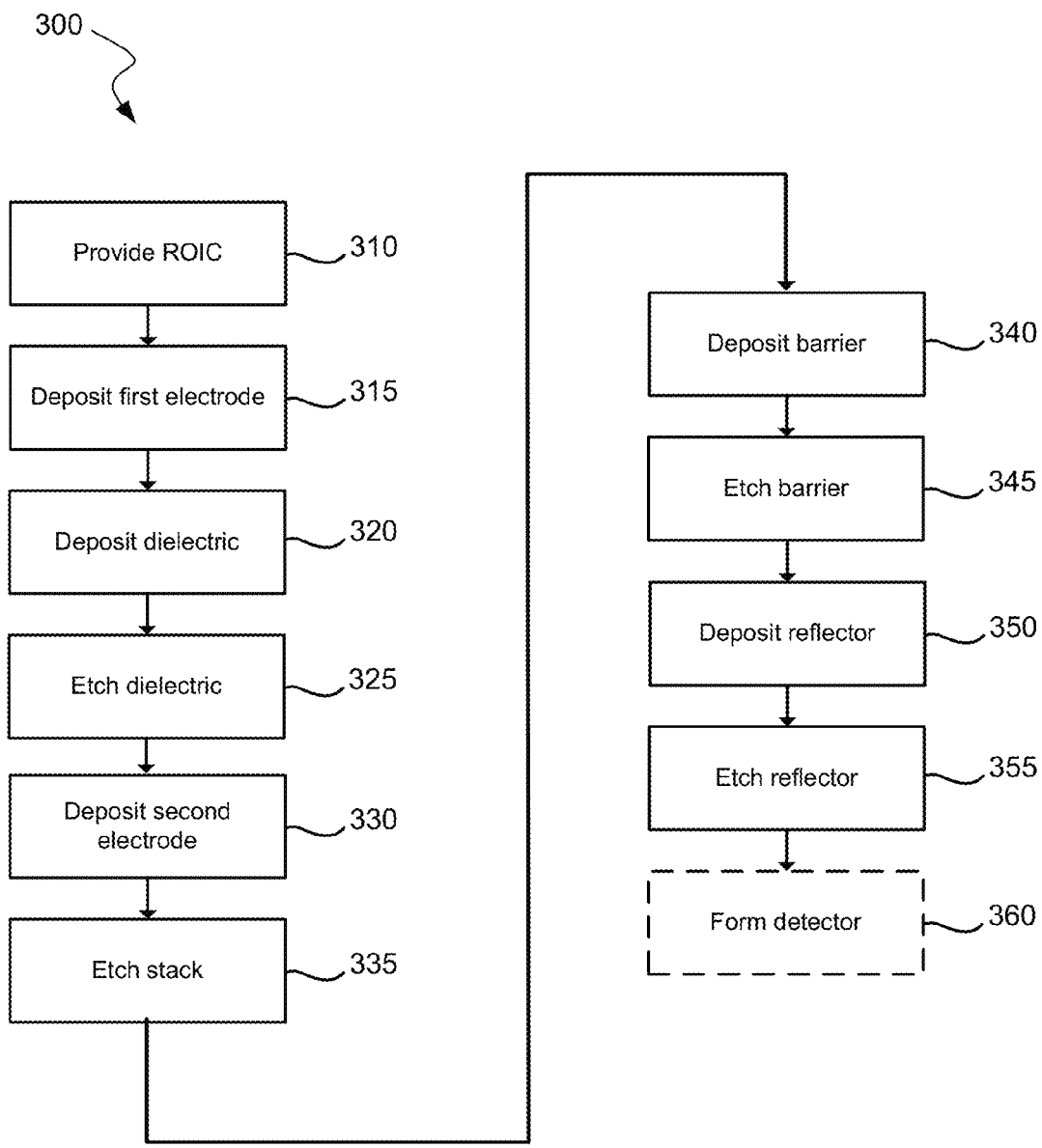
FIG. 3 is a method of forming a high density capacitor in a focal plane array matrix according to embodiments of the present technology.
Figure 4:
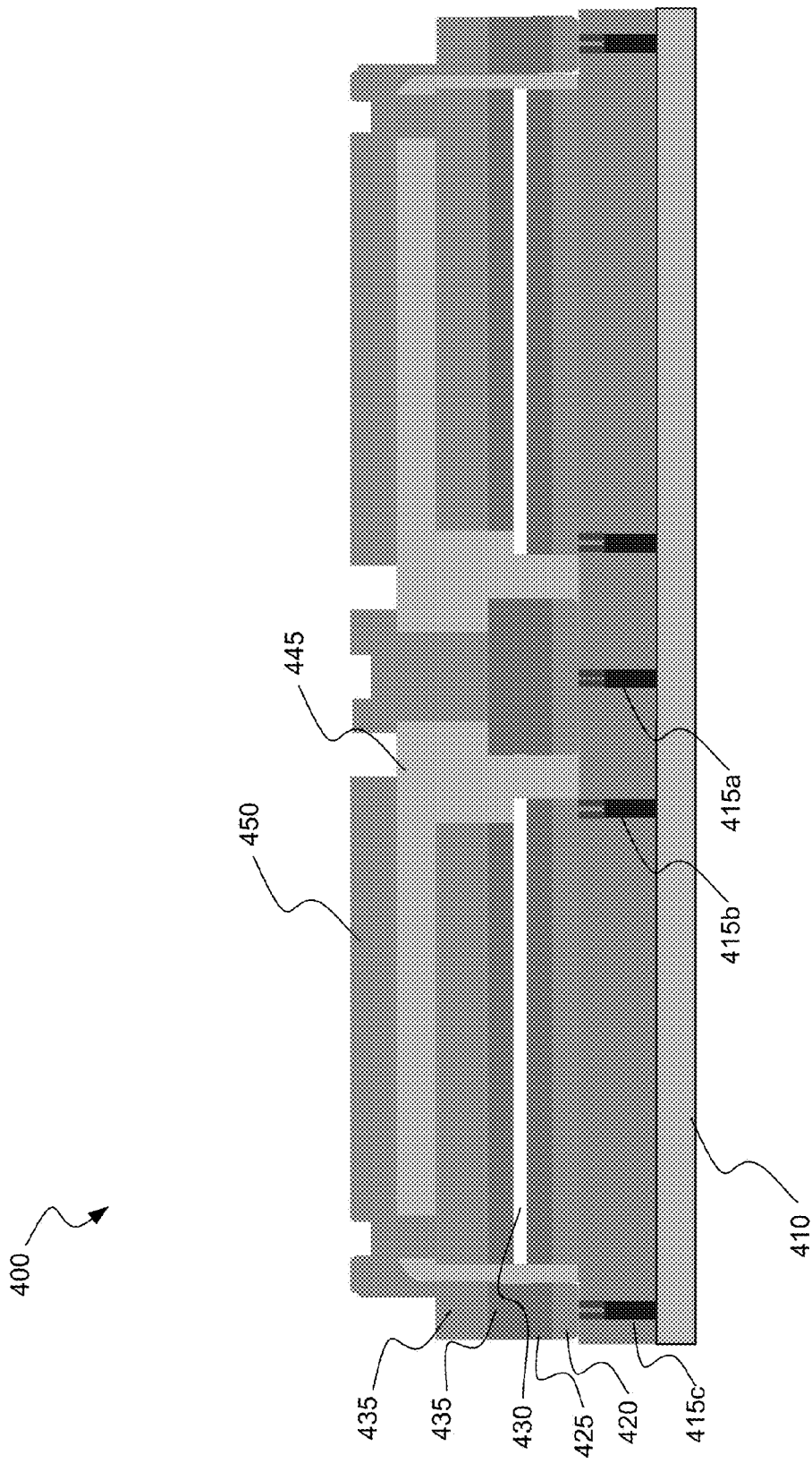
FIG. 4 is a cross-sectional view of a capacitor structure formed over a readout integrated circuit according to embodiments of the present technology.

FIG. 3 shows an exemplary process 300 by which a capacitor structure may be formed on a ROIC. A cross-sectional view of a capacitor structure 400 formed over a ROIC according to the method of FIG. 3 is shown in FIG. 4. As illustrated, a ROIC is provided at step 310 on which a capacitor structure may be formed. The ROIC may comprise a pre-processed silicon, silicon dioxide, silicon-on-insulator, germanium, gallium arsenide, or other III-V or II-VI material. An exemplary ROIC 410 as shown in FIG. 4 may include specific connectors 415 for integrating the detector and overlying capacitor structure. As illustrated, connector 415c will later integrate the top electrode of the capacitor structure, connector 415b will integrate the bottom electrode of the capacitor structure, and 415a will integrate the detector (not shown).

A first electrode may be deposited over the ROIC at step 315. The electrode may be deposited with various fabrication techniques that may include chemical vapor deposition, physical vapor deposition or sputtering, plasma enhanced chemical vapor deposition including high density plasma deposition, low pressure or sub-atmospheric chemical vapor deposition, epitaxial growth, or atomic layer deposition. The electrode material may include a transition metal or poor metal including metal nitrides or other combinations. For example, as shown in FIG. 4, a first electrode layer 420 may be deposited that includes titanium that is grown or formed over the ROIC structure. The layer may be less than or about 5 µm in height. Alternatively the layer height may be less than or about 3 µm, 1 µm, 500 nm, 400 nm, 375 nm, 350 nm, 325 nm, 300 nm, 250 nm, 200 nm, 175 nm, 150 nm, 125 nm, 100 nm, 75 nm, 50 nm, 25 nm, 10 nm, 7 nm, 5 nm, 3 nm, 1 nm, 7 angstrom, 5 angstrom, etc., or less.

In some embodiments of the technology a second electrode layer is deposited over the first electrode. The layer may include a similar or alternative metal than the first layer, and may include any of the materials previously described. As shown in FIG. 4, for example, a second electrode layer 425 is deposited over first electrode layer 420 that includes titanium nitride. As with the first electrode layer 420, the second electrode layer 425 may be less than or about 5 µm in height. Alternatively the layer height may be less than or about 3 µm, 1 µm, 500 nm, 400 nm, 375 nm, 350 nm, 325 nm, 300 nm, 250 nm, 200 nm, 175 nm, 150 nm, 125 nm, 100 nm, 75 nm, 50 nm, 25 nm, 10 nm, 7 nm, 5 nm, 3 nm, 1 nm, 7 angstrom, etc., or less. In alternative embodiments, additional layers of electrode material may be deposited over the first and second layers of electrode material forming the first electrode.

One or more of the bottom electrode layers may be deposited at a thickness and patterned to maximize current density such that the material may be ruptured during operation. For example, as shown in FIG. 4, either first electrode layer 420 or 425 may be deposited at a thickness such that a negative voltage exceeding a certain threshold may melt or otherwise rupture the electrode material effectively disconnecting the detector associated with the negative voltage. This feature may act as a fusing mechanism to disconnect detector pixels that have malfunctioned.

Over the first electrode material, a dielectric material may be deposited at step 320. The dielectric may include a metal oxide, metal nitride, metal oxynitride, metal carbide, or other known dielectric material. The metals utilized may include oxides or other formations including silicon, aluminum, titanium, zirconium, hafnium, molybdenum, or chromium, for example. Alternative dielectric structures may include multiple layers of material to provide a combination of dielectric characteristics. For example, the layers may include more than or about 1, 2, 3, 4, 5, 6, 7, 8, 9, 10, 11, 12, 13, 15, 17, 20, 23, 25, etc., or more layers of material. The layers may include multiple materials layered in a variety of ways including alternating layers or two or more materials, or an ordered stack of materials that are then reversed and re-layered for a complete structure. As shown in FIG. 4, dielectric material 430 is deposited in one or more layers over the layers of first electrode material. The layer of dielectric material may be less than or about 5 µm in height. Alternatively the layer height may be less than or about 3 µm, 1 µm, 500 nm, 400 nm, 375 nm, 350 nm, 325 nm, 300 nm, 250 nm, 200 nm, 175 nm, 150 nm, 125 nm, 100 nm, 75 nm, 50 nm, 25 nm, 10 nm, 7 nm, 5 nm, 3 nm, 1 nm, 7 angstrom, etc., or less. In alternative embodiments each internal layer of the dielectric material may be less than or about any of the heights listed. The total height for the layers of dielectric material may vary based on specific application requirements to preferentially minimize leakage current, maximize breakdown voltage, or maximize capacitance density.

After the one or more layers of dielectric material have been deposited or grown, the dielectric structure may be etched at step 325. The dielectric may be etched down to the level of the first electrode material, and the etching may be performed with a wet or dry etching process that selectively removes the dielectric material in relation to the first electrode material. A resist layer may first be deposited such that the dielectric material is removed in certain portions over the substrate, but is substantially maintained in others. As shown in FIG. 4, dielectric material may be removed over the areas including connector 415c for the top electrode contact, as well as the area over connector 415a for the detector contact. Following removal of the dielectric material, post-processing steps may be performed including removal of the resist material.

At process step 330 the second electrode material may be deposited over the structure. The electrode material may be deposited by any of the previously listed methods, and may be formed by a similar or different method than the first or bottom electrode. Additionally, the electrode material may include any one of or a combination of any of the previously listed materials. The second electrode may include one or more layers of electrode materials that may be formed in a similar manner as the first electrode. Alternatively, a different electrode structure may be formed with the second electrode. As with the first electrode material, each one of the second electrode layers, or the combination of materials forming the second electrode materials may have a thickness of less than about 5 µm in height. Alternatively the layer height may be less than or about 3 µm, 1 µm, 500 nm, 400 nm, 375 nm, 350 nm, 325 nm, 300 nm, 250 nm, 200 nm, 175 nm, 150 nm, 125 nm, 100 nm, 75 nm, 50 nm, 25 nm, 10 nm, 7 nm, 5 nm, 3 nm, 1 nm, 7 angstrom, etc., or less.

As shown in FIG. 4, electrode material 435 may be deposited directly over the dielectric material. For example, the electrode material 435 may be the same as the second electrode material 425 deposited with the first electrode. After the first electrode material 435 of the second electrode has been deposited, a second layer of electrode material 440 of the second electrode may be formed. The second layer of electrode material 440 may be the same or a different material than the first layer of electrode material 435. As shown in FIG. 4, for example, the second layer of electrode material 440 of the second electrode may be the same material as the first layer of electrode material 420 of the first electrode, and may be titanium in one embodiment. Accordingly, a reversed material structure is formed in one exemplary capacitor structure between the first and second electrodes of the capacitor.

After the one or more layers of the second electrode are deposited, the capacitor stack may be etched at step 335. A resist pattern may be deposited over certain layers of the structure, and etching may be performed down to the level of the ROIC in order to form isolation regions between each structure associated with each of connectors 415a-415c. Any etching process or combination of processes may be used to remove the materials previously deposited over the ROIC. As illustrated in FIG. 4, each structure overlying the individual connectors 415a, 415b, 415c is isolated from one another. An additional etch process may be performed to remove the second electrode material overlying connector 415b. This additional etch process may provide additional isolation between the detector landing connections and the capacitor structure.

A barrier layer may be deposited over the capacitor structure at step 340. The barrier layer may be an insulating material such as silicon dioxide, or some other insulating material as previously described, or as may otherwise be used for isolating the structures overlying the ROIC. The barrier layer may be deposited by any of the methods as previously described, and may be deposited by plasma enhanced chemical vapor deposition in one example. The deposited barrier layer may have a thickness of less than about 5 µm in height. Alternatively the layer height may be less than or about 3 µm, 1 µm, 500 nm, 400 nm, 375 nm, 350 nm, 325 nm, 300 nm, 250 nm, 200 nm, 175 nm, 150 nm, 125 nm, 100 nm, 75 nm, 50 nm, 25 nm, 10 nm, 7 nm, 5 nm, 3 nm, 1 nm, 7 angstrom, etc., or less. As shown in FIG. 4, the barrier layer 445 is deposited to fully isolate the regions down to the level of the ROIC. In some embodiments multiple deposition and/or etching steps may be performed to ensure proper step coverage of the structure.

The barrier layer may be etched at step 345 to provide access to the underlying structures while maintaining adequate isolation of the structures from one another. A resist pattern may be deposited prior to the etching to ensure proper removal areas. Any of the previously discussed etching methods may be performed that selectively removes the barrier layer material while substantially maintaining the underlying structure.

The reflector material may be deposited over the barrier regions and into the accessed regions underlying the barrier material at step 350. The reflector material may be a material that is capable of directing incident photons back through the detector structure for improved detection. The reflector may be a metal or metal-containing material as previously described, and may be aluminum or titanium in various embodiments. The deposited reflector layer may have a thickness of less than about 1 µm. Alternatively, the thickness may be less than or about 500 nm, 400 nm, 375 nm, 350 nm, 325 nm, 300 nm, 250 nm, 200 nm, 175 nm, 150 nm, 125 nm, 100 nm, 75 nm, 50 nm, 25 nm, 10 nm, 7 nm, 5 nm, 3 nm, 1 nm, 7 angstrom, etc., or less. As shown in FIG. 4, the reflector material 450 fills in the previously etched gaps in the barrier layer 445. As illustrated, by forming the barrier layer 445 and reflector layer as described, connector 415c is provided access to the top electrode or second electrode of the capacitor structure. Accordingly, the connection for the top electrode as illustrated in FIG. 2 may be provided by the isolation of a portion of the capacitor structure so that the reflector material contacts both the isolated portion and the top electrode of the isolated capacitor structure. This may provide a lower fabrication cost and complexity due to the material selection, thickness, and simplified etching and patterning of the other blanket depositions. Additionally, the reflector layer may be used as a power distribution layer, which may decrease voltage drops during operation.

The reflector material may be etched at step 355 to isolate the detector connector section from the top electrode structure. Any of the previously described etch processes may be performed to remove the portions of the reflector material for isolating the center detector connection. As shown in FIG. 4, the completed capacitor structure provides a reflector material 450 that also acts as the top electrode contact region. Additionally, the first layer of electrode material 420 of the first electrode provides a contact region providing access to each connector 415. As such, reduced pixel pitch and concomitant circuit component reduction may not affect the ability to provide adequate contact with each connector of the ROIC. Additionally, the areas in which the dielectric insulation was removed, direct electrical connections can be provided through the stacked electrode and reflector materials. Hence, connector 415c for the top electrode and connector 415a for the detector can be accessed through the stacked structure without interfering with the capacitor performance due to the barrier layer 445.

After formation of the capacitor structure over the ROIC has been performed, further processing steps may be performed. A detector may optionally be formed over the capacitor and reflector structure at step 360. The detector may be grown or formed directly over the reflector material, or may alternatively be formed separately and then connected to the reflector and capacitor structure. Post-processing including via etching may also be formed to produce the photodiode functionality. Additional isolation layers may or may not be formed over regions of the reflector material in order to further prevent electrical connections from forming between the detector contact region and the capacitor region.

Any of the previously described processing steps, as well as additional polishing, annealing, or curing may be performed at temperatures of about 800° C. or less to protect the underlying and preformed ROIC structure. Alternatively, the processes may be performed at or below about 700° C., 600°

C., 500° C., 450° C., 400° C., 350° C., 300° C., 200° C., 150° C., 100° C., etc. or less. The deposited layers of material over the ROIC with or without the detector material may have a total height of less than or about 10 µm. Alternatively, the deposited layers of material may have a total height of less than or about 7 µm, 5 µm, 3 µm, 2 µm, 1 µm, 800 nm, 750 nm, 600 nm, 500 nm, 450 nm, 400 nm, 350 nm, 300 nm, 250 nm, 200 nm, 150 nm, 100 nm, 50 nm, etc., or less.

Figure 5:
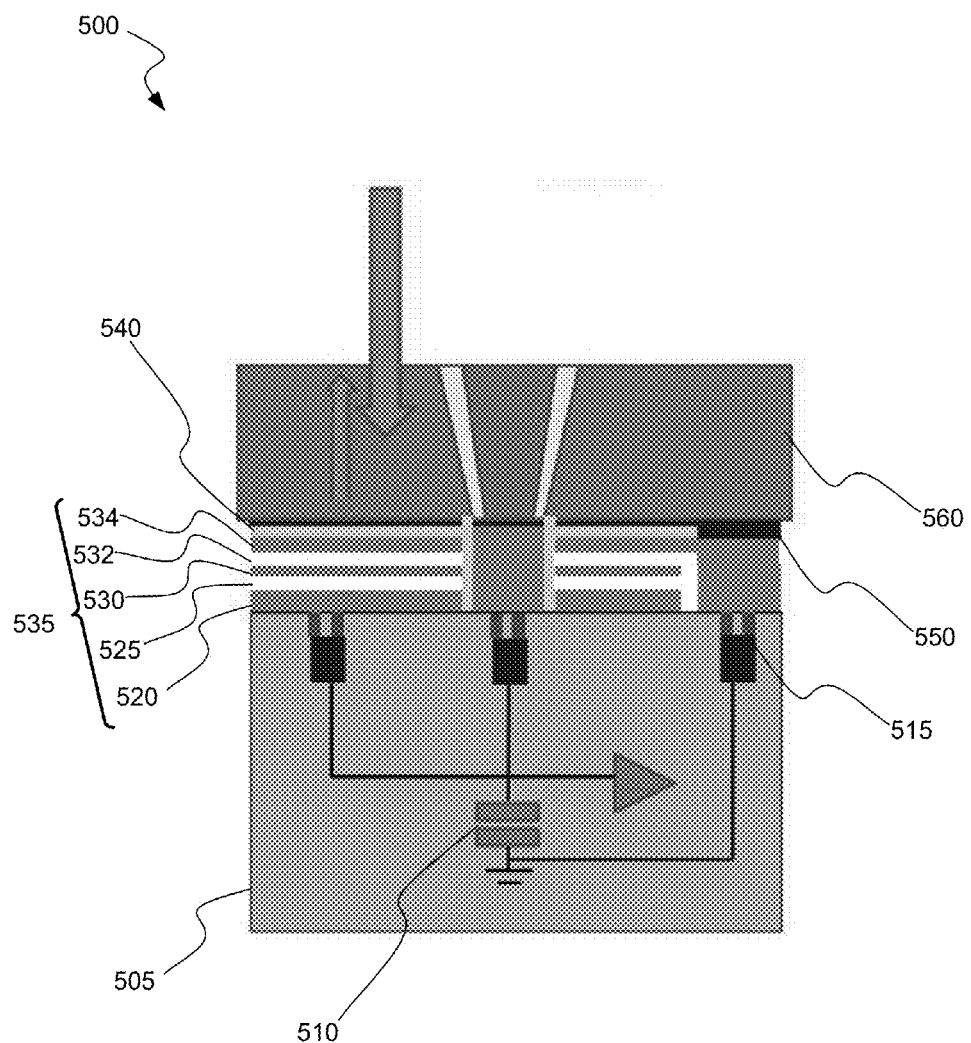
FIG. 5 is a cross-sectional view of another capacitor structure formed over a readout integrated circuit according to embodiments of the present technology.

FIG. 5 illustrates a cross-sectional view of an alternative multi-capacitor structure that may be incorporated into the array. Similar to the structure of FIG. 1, a ROIC 505 is provided including storage well capacitor 510, and connectors 515. Overlying the ROIC is capacitor structure 535, but unlike the capacitor structure of FIG. 1, capacitor 535 utilizes multiple capacitor layers to provide stacked capacitors. The electrode and dielectric materials utilized by the stacked capacitor 535 may include any of the materials as previously discussed. Each of the layers of electrodes may include multiple layers as previously described. Additionally, each dielectric layer may include a plurality of dielectric layers as described above. Each electrode may be the same or different materials as the other electrode layers, and each dielectric layer may include materials similar to or different from each other dielectric layer.

As shown, capacitor 535 may include first electrode 520 disposed overlying the ROIC substrate. First dielectric layer 525 may be formed over the first electrode 520. Intermediate electrode 530 may be located above the first dielectric layer 525. A second dielectric layer 532 may be located over the intermediate electrode 530, and a top or third electrode 534 may be disposed above the second dielectric 532. Electrodes within the structure may be electrically coupled together to provide the capacitor functionality. For example, first electrode 520 and third electrode 534 may be electrically coupled to act as a first capacitor plate, with second electrode 530 acting as a second capacitor plate. In such a configuration, with the two layers of dielectric material, twice as much capacitance density can be provided compared to a single capacitor structure. Additional structures may include several more dielectric and electrode layers to provide even greater capacitance density. For example, 2, 3, 4, 5, 6, 7, 8, 9, 10, etc., or more layers of dielectric material or materials may be disposed between a number of electrode plates to provide a number of capacitor structures that do not increase the pixel pitch dimensions of the array. The electrodes can be coupled in any number of ways, including physically and electrically, providing a variety of capacitor structures as required by any particular application.

The integrated capacitor structure may provide multiple capacitors per pixel with any number of capacitors as described. The increased capacitance provided may facilitate multiple color displays, or additional functioning including sample and hold, or other circuit functionality.

Figure 6A:
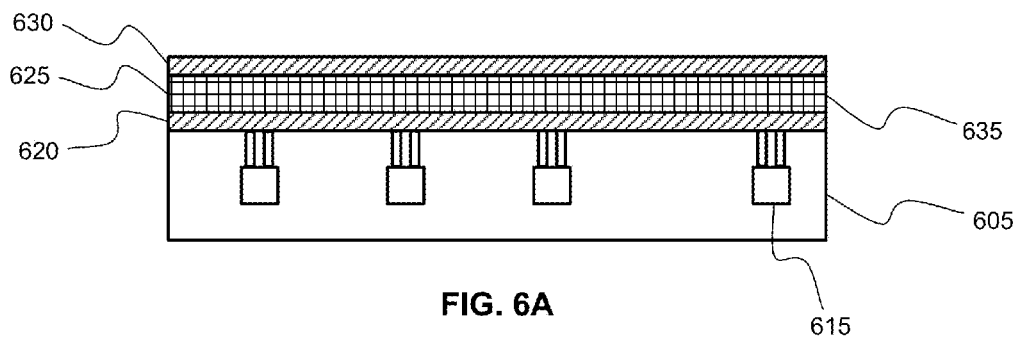
FIGS. 6A-6I are cross sectional illustrations of exemplary process steps for forming a photodetector structure according to embodiments of the present technology.

Turning to FIGS. 6A-6I, cross sectional views of a photodetector structure are shown at different stages of a manufacture process for forming a photodetector. The process may include forming an external capacitor 635 over a substrate 605, as illustrated in FIG. 6A. As described in more detail below a photodetector may be formed over the external capacitor. The external capacitor 635 may be electrically coupled with the substrate 605 via connectors 615. The substrate 605 may be a circuit component, such as a readout integrated circuit, and may include an internally integrated capacitor such as previously described. The size and shape of the circuit may be based on the number of pixels to be defined, a required area of the array, and so on. External capacitor 635 may include a first electrode 620 formed directly over the substrate and in direct contact with or otherwise electrically coupled with the substrate 615. The electrode may be sputtered or formed by chemical vapor deposition, atomic layer deposition, and other techniques for forming an electrode layer. In disclosed embodiments the electrode may include more than one material and may include multiple layers of material as previously described. One or more dielectric materials 625 may be formed overlying the first electrode 620 and may include any of the orientations or configurations as discussed above. In one example, the dielectric material may include a multilayer dielectric material. A second electrode 630 may be formed overlying the dielectric material 625, and again may include any of the configurations or layers as discussed elsewhere in this disclosure. Although not shown in the illustration, the external capacitor 635 may be electrically coupled with the substrate 605 such that the external capacitor and an internally integrated capacitor in the substrate are coupled in parallel with one another such as previously described. The capacitors may be configured to operate in parallel, or may alternatively operate in series, or some other coupling arrangement in disclosed embodiments.

Figure 6B:
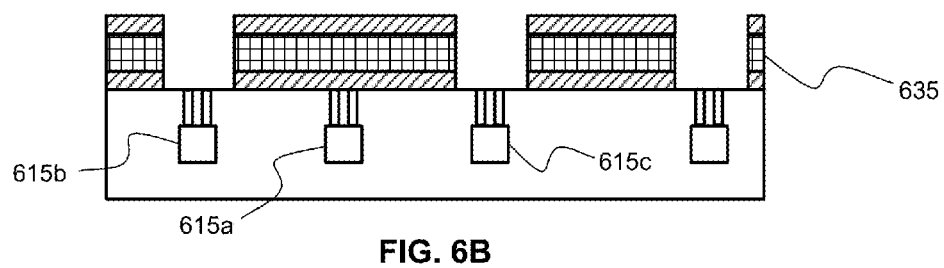
Figure 6C:
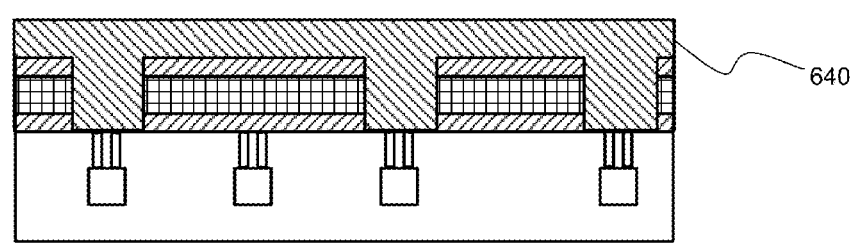

As illustrated in FIG. 6B, the external capacitor structure 635 may be etched to isolate individual capacitors and expose certain connectors 615. For example, connector 615a may be electrically coupled with the first electrode in order to form the first electrical connection for the external capacitor operation. Connector 615b may be configured for the electrical coupling of the second electrode, and connector 615c may be configured for the electrical coupling of the detector, for example, and thus these connectors may be exposed in the etching in order to provide access for electrical coupling. Although illustrated as an etching operation performed after the formation of each of the external capacitor layers, in disclosed embodiments each layer of material may be etched subsequently to the formation of the individual layer. A dielectric material 640 may be formed to isolate the capacitor structures and the electrodes from one another. The dielectric may be blanket deposited over the structure, for example, and may operate as a barrier to subsequent layers formed overlying the external capacitor structure.

Figure 6D:
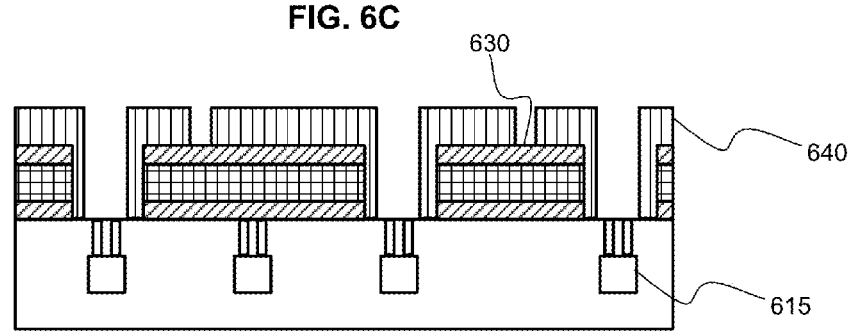
Figure 6E:
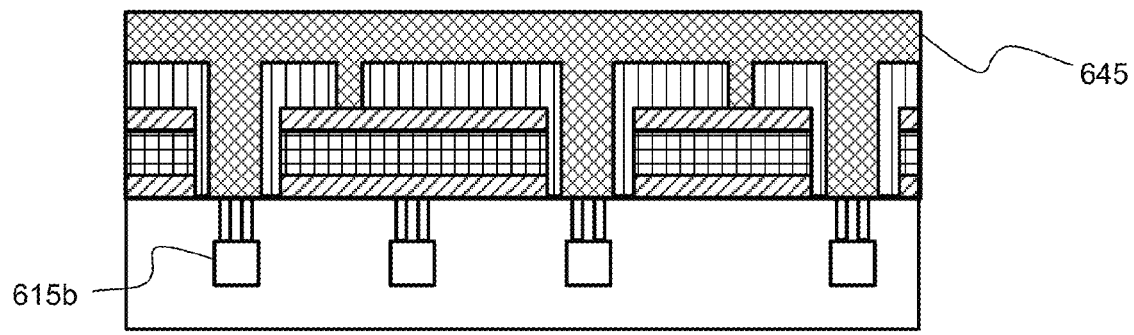
Figure 6F:
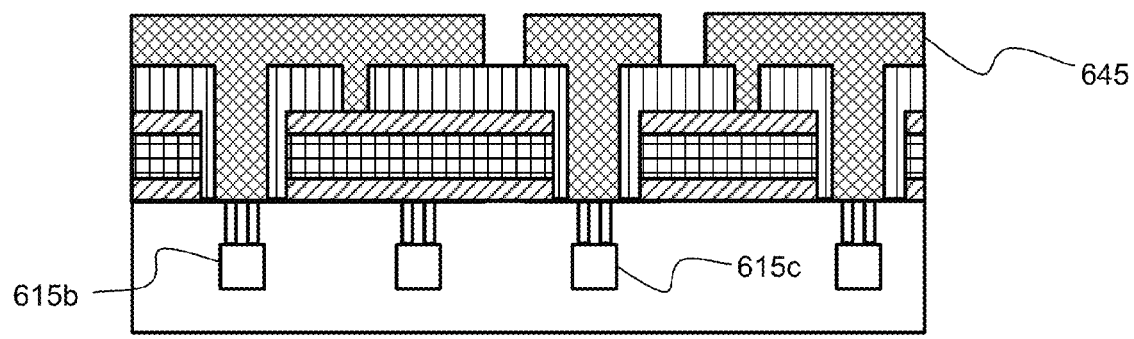

A subsequent etching operation may be performed on the dielectric material 640 as illustrated in FIG. 6D in order to expose the connectors 615 and provide access for electrical coupling of the second electrode 630. A reflector material 645 may be deposited over the structure and may be configured to provide energy reflection back through an overlying detector structure. The reflector may also be configured to electrically couple the second electrode with the substrate, such as illustrated in FIG. 6E at connector 615b for example. Dielectric material 640 may provide the barrier so as to maintain the first and second electrodes electrically isolated from one another for operation, and may define the access to the underlying substrate electrical connections for the reflector material. As shown in FIG. 6F, an etching operation may be performed to isolate regions of the reflector material providing electrical coupling to the connectors 615 in the underlying substrate. For example, connector 615b may be configured to provide electrical coupling for the second or top electrode of the external capacitor structure, and connector 615c may be configured to provide electrical coupling for the overlying detector.

Because reflector material 645 may provide the electrical coupling for both connectors, the etching operation may isolate the sections, and thereby isolate the connectors from one another. Accordingly, the external capacitor may be electrically coupled with the substrate at electrical connectors separate from the electrical connectors to which the photodetector may be coupled.

Figure 6G:
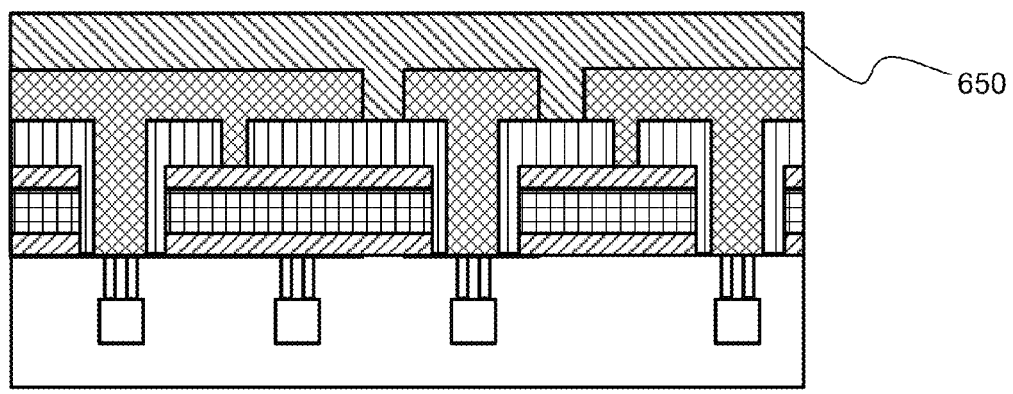
Figure 6H:
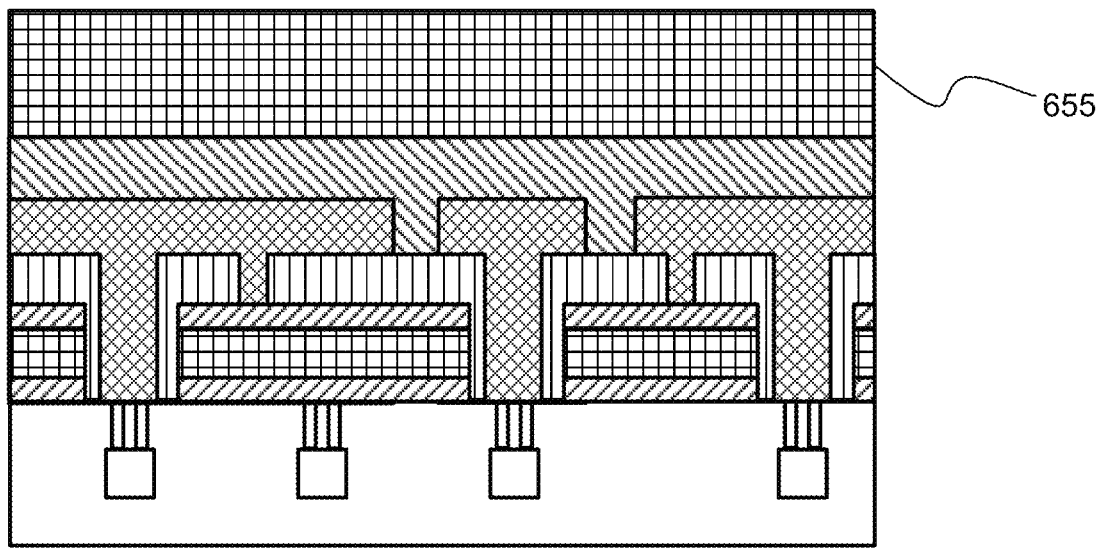
Figure 6I:
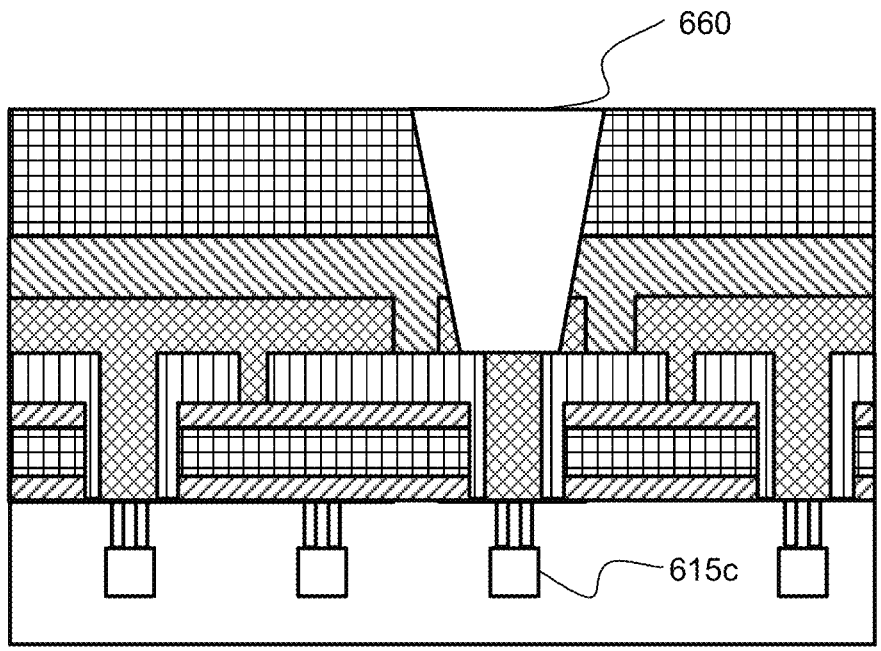

A subsequent material 650 may be deposited over the reflector material as illustrated in FIG. 6G, and may be configured to maintain the sections of the reflector material coupling the second electrode and the detector separate from one another in order to electrically isolate the connectors from one another. The material 650 may also operate to at least partially planarize the structure prior to connecting the detector material. The material 650 may additionally operate as an adhesive to couple the detector to the substrate and external capacitor structure. In disclosed embodiments the material 650 may be a transparent material or epoxy in order to allow the reflector to function, and not prevent transmission of energy sources through the material 650. Detector material 655 may be formed or connected overlying the material 650 as illustrated in FIG. 6H. As shown in FIG. 6I, subsequent processing may be performed to form a collector structure through the detector material 655 and access the electrical connector associated with the detector, such as connector 615c, for example. In disclosed embodiments, more or less layers of material may be included in the photodetector structure. For example, multiple layers of electrodes, dielectrics, or other sections may be included in the photodetector formed.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the disclosed embodiments. Additionally, a number of well-known processes and elements have not been described in order to avoid unnecessarily obscuring the present technology. Accordingly, the above description should not be taken as limiting the scope of the technology.

It is noted that individual embodiments may be described as a process which is depicted as a flowchart, a flow diagram, or a block diagram. Although a flowchart may describe the method as a sequential process, many of the operations may be performed in parallel or concurrently. In addition, the order of the operations may be rearranged. A process may be terminated when its operations are completed, but could have additional steps not discussed or included in a figure. Furthermore, not all operations in any particularly described process may occur in all embodiments. A process may correspond to a method, a function, a procedure, a subroutine, a subprogram, etc.

Where a range of values is provided, it is understood that each intervening value, to the smallest fraction of the unit of the lower limit, unless the context clearly dictates otherwise, between the upper and lower limits of that range is also specifically disclosed. Each smaller range between any stated value or intervening value in a stated range and any other stated or intervening value in that stated range is encompassed. The upper and lower limits of those smaller ranges may independently be included or excluded in the range, and each range where either, neither, or both limits are included in the smaller ranges is also encompassed within the disclosed technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a dielectric material" includes a plurality of such materials, and reference to "the application" includes reference to one or more applications and equivalents thereof known to those skilled in the art, and so forth.

Also, the words "comprise", "comprising", "contains", "containing", "include", "including", and "includes", when used in this specification and in the following claims, are intended to specify the presence of stated features, integers, components, or steps, but they do not preclude the presence or addition of one or more other features, integers, components, steps, acts, or groups.

What is claimed is:

1. A method of forming a photodetector, the method comprising:
    forming an external capacitor over a substrate, wherein the external capacitor is electrically coupled with the substrate, and wherein the substrate comprises an internally integrated capacitor; and
    forming a photodetector over the external capacitor.

2. The method of claim 1, wherein forming the external capacitor further comprises:
    forming a first electrode over the substrate;
    forming a dielectric material over the first electrode; and
    forming a second electrode over the dielectric material.

3. The method of claim 2, wherein the dielectric material comprises a multilayer dielectric material.

4. The method of claim 2, wherein the method further comprises:
    forming a reflector material layer overlying the external capacitor, wherein the reflector material is configured to electrically couple the second electrode with the substrate.

5. The method of claim 1, wherein the external capacitor is electrically coupled with the substrate at electrical connectors separate from electrical connectors to which the photodetector is coupled.

6. The method of claim 1, wherein the external capacitor is electrically coupled with the substrate such that the external capacitor and internally integrated capacitor are configured to operate in parallel.

7. The method of claim 1, wherein the method further comprises:
    forming a dielectric layer overlying the external capacitor.

* * * * *